(12) United States Patent
Estan

(10) Patent No.: US 8,966,167 B1
(45) Date of Patent: Feb. 24, 2015

(54) CONTENT SEARCH SYSTEM HAVING MULTIPLE PIPELINES

(71) Applicant: Broadcom Corporation, Irvine, CA (US)

(72) Inventor: Cristian Estan, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/137,001

(22) Filed: Dec. 20, 2013

Related U.S. Application Data

(63) Continuation of application No. 13/226,237, filed on Sep. 6, 2011, now Pat. No. 8,639,875.

(51) Int. Cl.
G06F 12/00 (2006.01)
G11C 15/04 (2006.01)
G11C 15/00 (2006.01)

(52) U.S. Cl.
CPC ............... *G11C 15/04* (2013.01); *G06F 12/00* (2013.01); *G11C 15/00* (2013.01)
USPC .......................................... 711/108; 707/769

(58) Field of Classification Search
CPC .. G11C 15/00; G11C 15/04; G06F 17/30982; G06F 12/00
USPC .......................................... 711/108; 707/769
See application file for complete search history.

(56) References Cited

U.S. PATENT DOCUMENTS

| | | | |
|---|---|---|---|
| 2004/0215870 A1* | 10/2004 | Chow et al. | 711/108 |
| 2011/0145271 A1* | 6/2011 | Noyes et al. | 707/769 |
| 2012/0246400 A1* | 9/2012 | Bhadra et al. | 711/104 |

* cited by examiner

*Primary Examiner* — Hashem Farrokh
(74) *Attorney, Agent, or Firm* — Sterne, Kessler, Goldstein & Fox P.L.L.C.

(57) ABSTRACT

A content addressable memory (CAM)-based search engine is disclosed that reduces power consumption during a plurality of different search operations concurrently performed in a plurality of device pipelines by selectively applying one of a number of different power reduction techniques for each pipeline in response to configuration data indicating the type of search operation that is being performed in the pipeline.

20 Claims, 10 Drawing Sheets

700

| T | S | N | T | S | N | T | S | N | T | S | N |
|---|---|---|---|---|---|---|---|---|---|---|---|
| 1 | 2 | 1 | 21 | 5.38E+11 | 38 | 41 | 4.25E+23 | 78 | 61 | 3.83E+35 | 118 |
| 2 | 6 | 2 | 22 | 2.1E+12 | 40 | 42 | 1.68E+24 | 80 | 62 | 1.52E+36 | 120 |
| 3 | 20 | 4 | 23 | 8.23E+12 | 42 | 43 | 6.64E+24 | 82 | 63 | 6.03E+36 | 122 |
| 4 | 70 | 6 | 24 | 3.22E+13 | 44 | 44 | 2.62E+25 | 84 | 64 | 2.4E+37 | 124 |
| 5 | 252 | 7 | 25 | 1.26E+14 | 46 | 45 | 1.04E+26 | 86 | 65 | 9.51E+37 | 126 |
| 6 | 924 | 9 | 26 | 4.96E+14 | 48 | 46 | 4.11E+26 | 88 | 66 | 3.77E+38 | 128 |
| 7 | 3432 | 11 | 27 | 1.95E+15 | 50 | 47 | 1.63E+27 | 90 | 67 | 1.5E+39 | 130 |
| 8 | 12870 | 13 | 28 | 7.65E+15 | 52 | 48 | 6.44E+27 | 92 | 68 | 5.95E+39 | 132 |
| 9 | 48620 | 15 | 29 | 3.01E+16 | 54 | 49 | 2.55E+28 | 94 | 69 | 2.36E+40 | 134 |
| 10 | 184756 | 17 | 30 | 1.18E+17 | 56 | 50 | 1.01E+29 | 96 | 70 | 9.38E+40 | 136 |
| 11 | 705432 | 19 | 31 | 4.65E+17 | 58 | 51 | 4E+29 | 98 | 71 | 3.73E+41 | 138 |
| 12 | 2704156 | 21 | 32 | 1.83E+18 | 60 | 52 | 1.58E+30 | 100 | 72 | 1.48E+42 | 140 |
| 13 | 10400600 | 23 | 33 | 7.22E+18 | 62 | 53 | 6.27E+30 | 102 | 73 | 5.88E+42 | 142 |
| 14 | 40116600 | 25 | 34 | 2.85E+19 | 64 | 54 | 2.49E+31 | 104 | 74 | 2.34E+43 | 144 |
| 15 | 1.55E+08 | 27 | 35 | 1.12E+20 | 66 | 55 | 9.85E+31 | 106 | 75 | 9.28E+43 | 146 |
| 16 | 6.01E+08 | 29 | 36 | 4.43E+20 | 68 | 56 | 3.91E+32 | 108 | 76 | 3.69E+44 | 148 |
| 17 | 2.33E+09 | 31 | 37 | 1.75E+21 | 70 | 57 | 1.55E+33 | 110 | 77 | 1.47E+45 | 150 |
| 18 | 9.08E+09 | 33 | 38 | 6.89E+21 | 72 | 58 | 6.14E+33 | 112 | 78 | 5.83E+45 | 152 |
| 19 | 3.53E+10 | 35 | 39 | 2.72E+22 | 74 | 59 | 2.44E+34 | 114 | 79 | 2.32E+46 | 154 |
| 20 | 1.38E+11 | 37 | 40 | 1.08E+23 | 76 | 60 | 9.66E+34 | 116 | 80 | 9.2E+46 | 156 |

FIG. 7

CONTENT SEARCH SYSTEM HAVING MULTIPLE PIPELINES

CROSS-REFERENCE TO RELATED APPLICATION

This non-provisional application is a continuation of application Ser. No. 13/226,237, titled "Content Search System Having Multiple Pipelines," filed 6 Sep. 2011, the entirety of which is hereby incorporated by reference.

FIELD OF THE INVENTION

The present embodiments generally relate to content search systems, and more particularly to reducing power consumption of content search systems.

BACKGROUND ART

A network typically includes multiple access points (e.g., routers and servers) that switch and/or route data from a source to a destination along various transmission paths. Information is typically transmitted across networks such as the Internet as data packets. For example, when a file (e.g., e-mail, graphics, etc.) is sent from one node to another on a network, the file is divided into smaller data packets for more efficient transmission. The individual packets for a given file may travel different routes across one or more networks, with each packet containing both data and routing information. As such, a packet can be described as having a payload that contains the data, and a header that contains the routing information (e.g., a destination address).

A router is a device that determines the next network segment to which a packet is to be forwarded towards its destination. Routers, which can be positioned at points within a network and at points between networks, typically maintain tables of the available routes and their conditions for use to determine the best route between a source location and a destination location for a given packet. Indeed, a packet may travel through a number of network points having routers before arriving at its destination.

When a data packet arrives at the input of a router, several lookups are typically performed to determine the subsequent handling of the packet, as illustrated in FIG. 1. The lookups can include where to send the packet next (Next Hop), the quality of service requirement (QoS), the Ethernet port address, and so on. For example, consider a packet arriving at Router-A. Router-A determines whether the packet is destined for local servers connected directly to Router-A, or whether the packet should go to the next router (Router-B) towards its destination. Additionally, Router-A may assign a priority based on the destination address (DA) and the source address (SA) of the packet.

The packet header is typically parsed to extract information from different fields of the packet header to create different search keys associated with various different lookup operations. For example, a packet classification lookup can be performed to determine whether to allow or deny forwarding of the packet, a next hop lookup can be performed to determine whether the packet is meant for local servers or for Router-B, and a media access control (MAC) lookup can be performed to send the packet to the appropriate local server. Additional lookup operations can also be performed depending upon the network topology and/or routing requirements.

Many routers use one or more content addressable memory (CAM) devices to perform various lookup operations associated with routing packets across a network, and different lookup tables are typically stored in different groups of CAM blocks. For example, many CAM devices associated with a router include a first group of CAM blocks that store next hop routing information, a second group of CAM blocks that store packet classification information, a third group of CAM blocks that store MAC addresses, and/or other CAM blocks that store other information. Although CAM devices are effective in allowing different types of search operations to be quickly performed when routing packets, power consumption associated with performing multiple search operations in a CAM device can be significant. Indeed, as storage density and data throughput increase, so do power consumption and heat generation of associated CAM devices.

Thus, there is a need to reduce the power consumption associated with performing a number of different search operations in a CAM device.

BRIEF DESCRIPTION OF THE DRAWINGS

Present embodiments are illustrated by way of example, and not by way of limitation, in the figures of the accompanying drawings and in which like reference numerals refer to similar elements and in which:

FIG. 7 is a table that depicts, for various sizes of CAM rows according to an embodiment, the number of balanced binary words that are possible and the equivalent binary data width according to prior encoding schemes.

DETAILED DESCRIPTION OF THE INVENTION

Figure 1:
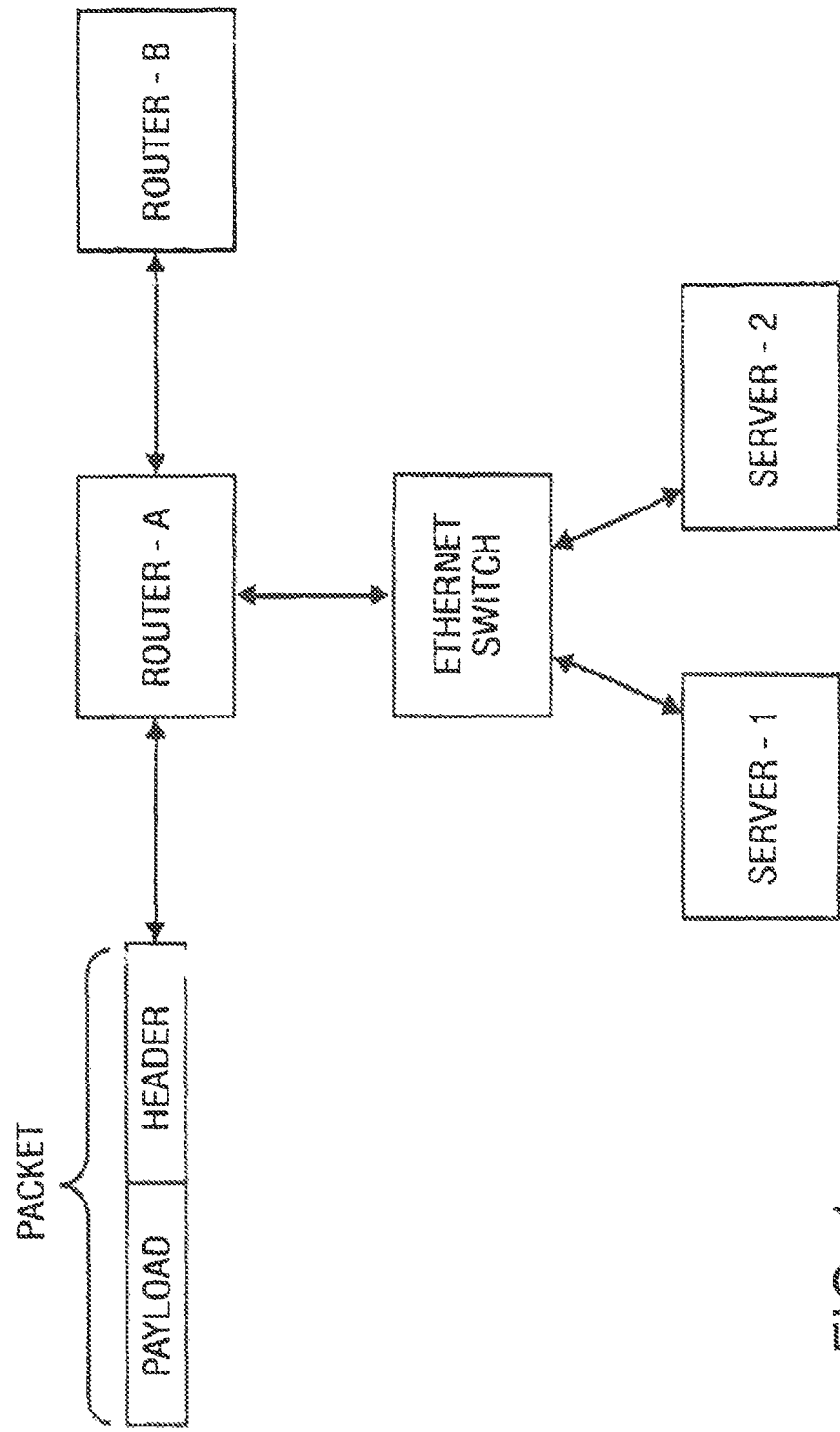
FIG. 1 depicts an exemplary packet handling by a router in a network.

A method and apparatus for reducing power consumption in a CAM device are disclosed. In the following description, for purposes of explanation, specific nomenclature is set forth to provide a thorough understanding of the present disclosure. However, it will be apparent to one skilled in the art that these specific details may not be required to practice the present embodiments. In other instances, well-known circuits and devices are shown in block diagram form to avoid obscuring the present embodiments unnecessarily. Additionally, the interconnections between circuit elements or blocks may be shown as buses or as single signal lines. Each of the buses may alternatively be a single signal line, and each of the single signal lines may alternatively be a bus. Further, the logic levels assigned to various signals in the description below are arbitrary, and therefore may be modified (e.g., reversed polarity) as desired. Accordingly, the present embodiments are not to be construed as limited to specific examples described herein but rather include within their scope all embodiments defined by the appended claims.

The present embodiments include various method steps, which will be described below. The steps may be performed by hardware components or may be embodied in machine-executable instructions, which may be used to cause hardware components (e.g., a processor, programming circuit) programmed with the instructions to perform the steps. Alternatively, the steps may be performed by a combination of hardware and software.

The present embodiments may be provided as a computer program product, or software, that may include a machine-readable medium having stored thereon instructions. The machine readable medium may be used to program a computer system (or other electronic devices) to generate articles (e.g., wafer masks) used to manufacture the present embodiments. The machine-readable medium may include, but is not limited to, optical disks, CD-ROMs, and magneto-optical disks, ROMs, RAMs, EPROMs, EEPROMs, magnet or optical cards, flash memory, or other type of media/machine-readable medium suitable for storing electronic instructions and/or data.

The machine readable medium may store data representing an integrated circuit design layout that includes the present embodiments. The design layout for the integrated circuit die may be generated using various means, for examples, schematics, text files, gate-level netlists, hardware description languages, layout files, etc. The design layout may be converted into mask layers for fabrication of wafers containing one or more integrated circuit dies. The integrated circuit dies may then be assembled into packaged components. Design layout, mask layer generation, and the fabrication and packaging of integrated circuit dies are known in the art; accordingly, a detailed discussion is not provided.

For purposes of discussion herein, an access control list (ACL) contains a set of rules, and each rule is identified by a rule number and includes a source address field, a destination address field, a source port field, a destination port field, a protocol field, and an action field. The source address field contains a source address (SA) that can be compared with the source address of incoming packets, and the destination address field contains a destination address (DA) that can be compared with the destination address of incoming packets. Together, the SA and DA represent the Layer-3 (L3) or network layer addresses. The source and destination port fields contain source and destination port entries that are compared with the source and destination address port values of incoming packets, which together represent the Layer-4 (L4) or transport layer addresses. For example, the source and destination port addresses are typically represented as a single decimal number (e.g., port 80).

The protocol field contains a protocol value that is compared with the protocol of incoming packets. For example, the protocol can identify the transmission control protocol (TCP), the user datagram protocol (UDP), the internet control message protocol (ICMP), and so on. The action field stores an action to be taken for packets matching the rule. For example, the action can "permit" the packet to be forwarded or to "deny" the packet from being forwarded. Of course, each rule can contain additional fields such as, for example, a class code and/or other information that can be matched with information contained in an incoming packet's header.

The present embodiments reduce power consumption of a CAM-based search engine during a plurality of different search operations concurrently performed in a plurality of device pipelines by selectively applying one of a number of different power reduction techniques for each pipeline in response to configuration data indicating the type of search operation that is being performed in the pipeline. More specifically, for some embodiments, each pipeline includes a filter circuit and a power control unit, can be dynamically associated with a group of any CAM array blocks of a shard memory core, and can be configured to perform a variety of different types of search operations in response to the configuration data. For each pipeline, the filter circuit extracts selected information from the packet header to create a corresponding search key that is specific to the type of search operation assigned to the pipeline. In response to the configuration data, the power control unit selects one of the different power control techniques to reduce power consumption of the associated search operation by selectively enabling a minimum number of the associated group of CAM blocks for the search operation while ensuring that the search operation produces the correct results. For different packets, different subsets of the associated CAM blocks can be selectively enabled, for example, depending upon the type of search operation requested for the packet. By selectively applying power reduction techniques specifically tailored to different types of search operations, CAM devices configured in accordance with the present embodiments can utilize variances in different types of search operations to more effectively reduce power consumption, as compared to conventional CAM devices.

Further, because CAM devices according to the present embodiments include an integrated power control unit that can dynamically apply different power reduction techniques to different search pipelines, the number of CAM blocks associated with each pipeline can be dynamically assigned and selectively enabled to minimize power consumption without interfacing with an external controller or processor. In contrast, conventional CAM devices capable of concurrently performing different types of search operations must rely upon an external power control module (e.g., provided within an external network processing unit (NPU) or ASIC coupled to the CAM device) to apply user-defined power reduction techniques.

Indeed, because such conventional external power control modules typically select a power profile from a relatively small and statically-configured list of profiles, these external power control modules are undesirably limited by the number of profiles supported by legacy CAM devices, and are typically unable to dynamically assign and selectively enable small subsets of CAM blocks in response to specific characteristics of the requested search operations. Indeed, by integrating the power control units within the search pipelines of the CAM device, the present embodiments are able to dynamically enable and disable CAM blocks according to the contents of the search key and/or the specific nature of the requested search operation, which in turn allows the present embodiments to achieve finer granularity in determining which CAM blocks can be disabled for the search operation without adversely affecting the correctness of its match results.

Figure 2:
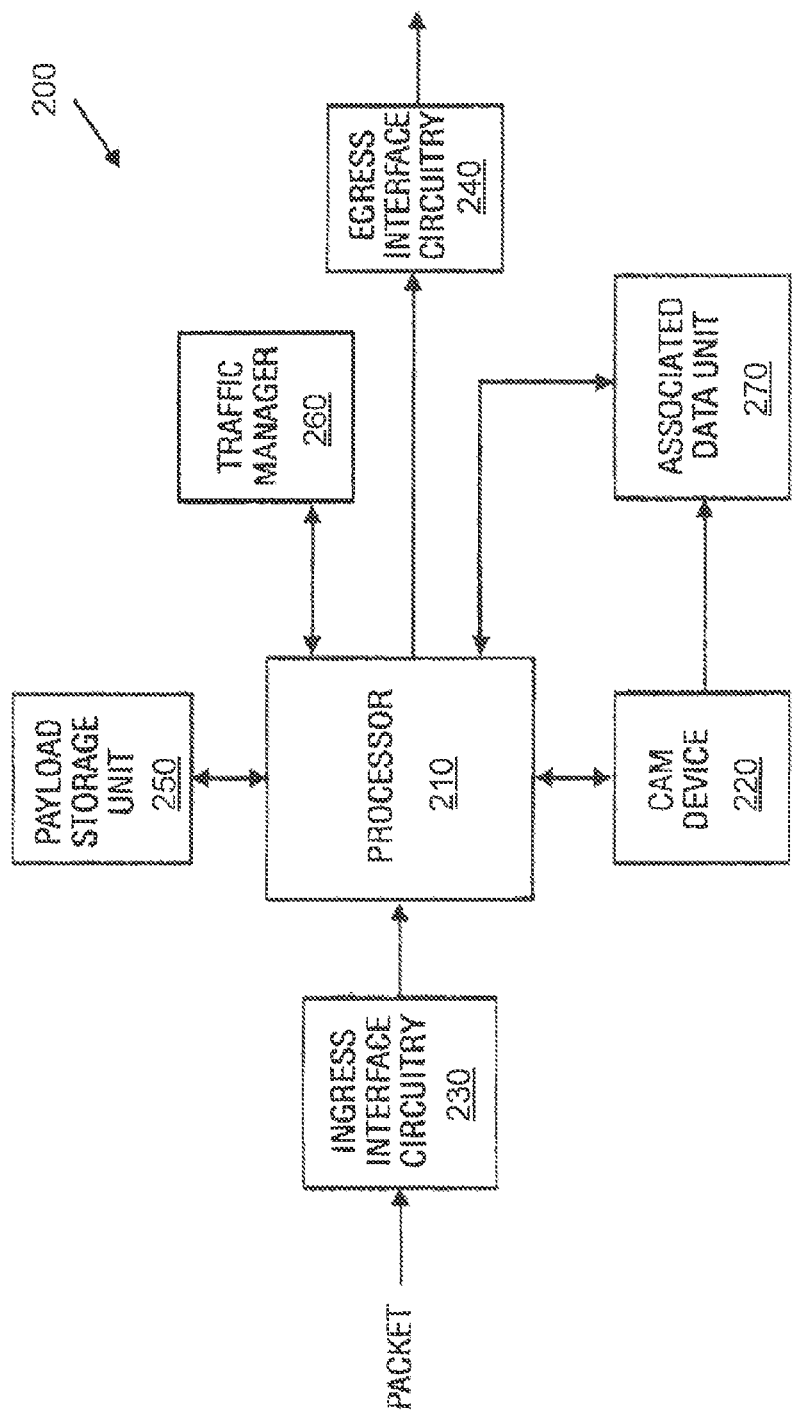
FIG. 2 shows a line card or blade of a router having a CAM device configured to perform different search operations concurrently in accordance with some embodiments.

FIG. 2 depicts one embodiment of a line card 200 of a router having a CAM device configured to perform concurrent search operations. Line card 200 includes a processor 210, a CAM device 220, an ingress interface circuitry 230, an egress interface circuitry 240, a payload storage unit 250, a traffic manager 260, and an associated data storage unit 270.

Processor 210 controls the overall operation of line card 200. For example, in operation, processor 210 receives a packet from a network medium through ingress interface circuitry 230, stores the packet's payload in payload storage unit 250, and then processes the packet's header information to determine which types of search operations will be performed to route the packet. Ingress circuitry includes, for example, PHY and MAC devices. Processor 210 sends out packets on a network medium through egress interface circuitry 240 in response to search operations performed by CAM device 220. Egress interface circuitry 240 may be connected to a switch fabric or directly to one or more other routers or switches. Processor 210 may be one or more network processor units (NPUs), microprocessors, or one or more special purpose processors such as a digital signal processor (DSP). In another embodiment, processor 210 may be another type of controller such as, for example, a field programmable gate array or a general purpose processor. The processor 210, ingress interface circuitry 230, and egress interface circuitry 240 components of a router are known in the art, and therefore a detailed discussion is not provided herein.

More specifically, in response to the packet header information, processor 210 determines the number and types of search operations to be performed by one or more of CAM devices 220, and forms the search keys for these search operations. The search operations can include, for example, packet classification lookups, forwarding (e.g., next hop) lookups, MAC lookups, MPLS lookups, and so on. When multiple searches for the same packet are requested, processor 210 forms a composite search key that includes at least two, and as many as all, of the various search keys for the lookups. The composite search key is provided as a common input string to CAM device 220. CAM device 220 selectively identifies and extracts the individual search keys from the common input string and provides the individual search keys to the associated CAM blocks to perform the lookups. The lookups can occur concurrently in the CAM blocks of CAM device 220, thereby advantageously increasing overall throughput over conventional systems in which searches are processed sequentially.

For some embodiments, CAM device 220 can be a multiple block CAM device with each block storing a different table for different search operations. For other embodiments, CAM device 220 can represent multiple single-block CAM devices with each CAM device storing a different table for different search operations. After one or more lookups are performed in CAM device 220, associated information for matching entries can be retrieved from associated data unit 270 and used to route the associated packet across the network (not shown for simplicity). Processor 210 then communicates with traffic manager 260 to schedule the exit of the packet from line card 200 via egress interface circuitry 240.

Figure 3:
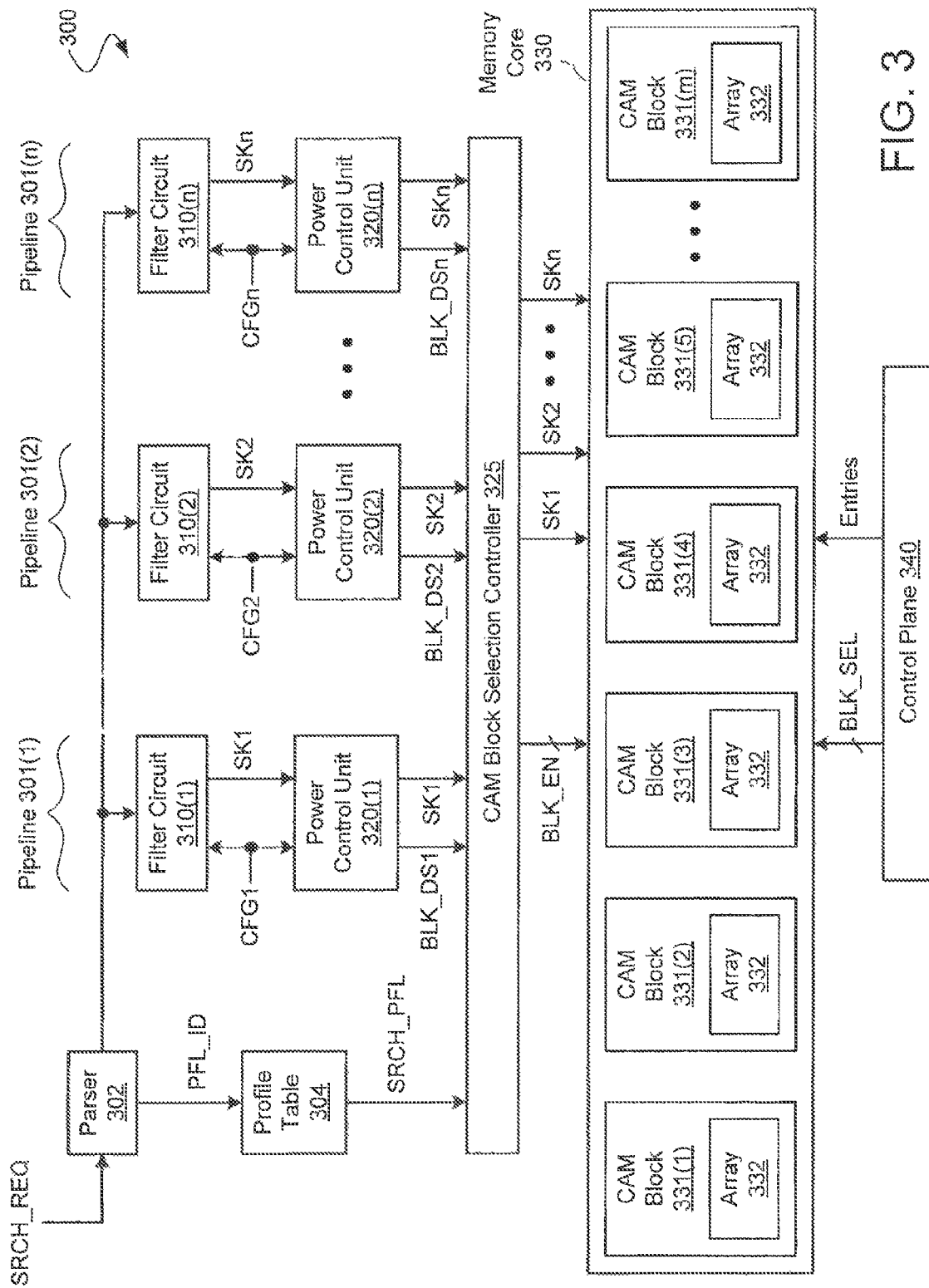
FIG. 3 is a block diagram of a multi-pipelined CAM device in accordance with the present embodiments.

FIG. 3 shows a multi-block CAM device 300 that is one embodiment of CAM device 220 of FIG. 2. CAM device 300 is shown to include a plurality of search pipelines 301(1)-301(n), a parser circuit 302, a profile table 304, a CAM block selection controller 325, a memory core 330, and a control plane 340. The memory core 330 includes a plurality of CAM blocks 331(1)-331(m). Each CAM block 331 includes a CAM array 332 having a plurality of rows of CAM cells (not shown in FIG. 3 for simplicity) for storing searchable data therein, for example, as discussed in more detail below with respect to FIGS. 4A-4B. Each row of CAM cells can also include one or more valid bits indicative of whether valid data is stored in the row. The valid bits can be used in a well-known manner to generate a full flag for CAM block 331. CAM blocks 331 can be any suitable type of CAM block including, for example, synchronous or asynchronous CAM blocks, and the CAM cells can be any suitable type of CAM cells including, for example, binary, ternary, and/or quaternary (XY) CAM cells. Further, each CAM block 331 can be any suitable size, and in some embodiments CAM blocks 331(1)-331(m) can be of different sizes.

The control plane 340 controls write operations to memory core 330, and determines where to store data entries within the memory core 330 (e.g., by selecting which storage location within the array 332 of a particular CAM block 331 will store a current data entry). For some embodiments, control plane 340 includes a function generator (not shown for simplicity) to generate a plurality of block select signals (BLK_SEL) that select one of the CAM blocks 331(1)-331(m) for the write operation. The function generator performs a predetermined logical operation on the data entry to assert one of the block select signals, and the asserted block select signal enables a corresponding one of the CAM blocks 331 to store the data entry. For some embodiments, the function generator uses a hash function to create a hashed data entry in response to the original data entry, and the hashed data entry is used (e.g., encoded) to generate the block select signals (BLK_SEL). For one such embodiment, the function generator is a well-known cyclic redundancy check circuit that generates the BLK_SEL signals in response to the data entry.

For example, for an exemplary embodiment in which memory core 330 includes 8 CAM blocks 331(1)-331(8), the function generator can be configured to perform a hash function on the data entry to generate a hashed data entry having one of eight possible values (e.g., binary values 0 to 7 inclusive), and the resulting hashed data entry can be used to selectively assert one of the 8 corresponding BLK_SEL signals to select a corresponding one of the 8 CAM blocks 331(1)-331(8) to store the data entry. In this manner, the contents of the data entry are used to select which CAM block 331 stores the data entry, thereby utilizing a dynamic content-based storage technique that stores each data entry in a location that is selected, at least in part, upon the contents of the data entry.

To concurrently perform different types of search operations on different data tables, the CAM blocks 331(1)-331(m) can be dynamically divided into a number of groups, where each group of CAM blocks 331 can store a different table (e.g., used to store data for an associated different type of search operation) and can be associated with a corresponding one of the pipelines 301. For some embodiments, each pipeline 301 can be dynamically assigned a specific group of CAM blocks 331 that store data for search operations performed by the pipeline 301. For example, in an exemplary embodiment, a first group of CAM blocks 331 can store rules associated with access control lists (ACLs) and perform packet classification lookup operations, a second group of CAM blocks 331 can store addresses associated with a forwarding information base (FIB) and perform internet protocol (IP) next hop routing lookup operations, a third group of CAM blocks 331 can store media access control (MAC) addresses and perform packet MAC lookup operations, and so on. For embodiments described herein, each type of search operation can be associated with any of the CAM blocks 331, irrespective of their physical location relative to one another (e.g., the CAM blocks 331 associated with a particular type of search operation can be selected arbitrarily, and thus do not need to have contiguous address ranges).

The parser circuit 302 includes an input to receive a search request (SRCH_REQ) from an external source (e.g., from the data plane or from an external NPU). The search request typically includes a packet header from which a search key can be derived, and includes a search profile ID that indicates which of the CAM blocks 331 are requested for a search operation with the search key. The parser circuit 302 is configured to extract the profile ID (PFL_ID) from the search request, and provides the profile ID (PFL_ID) as a look-up value to the profile table 304. For other embodiments, the parser circuit 302 can also extract the search key from the search request.

The profile table 304 stores a plurality of search profiles, and is configured to select one of the stored search profiles (SRCH_PFL) in response to the profile ID provided by parser circuit 302. The search profile selected by the profile ID is forwarded from the profile table 304 to the CAM block selection controller 325, which as explained in more detail below selectively enables the CAM blocks 331 for search operations. Each of the search profiles stored in profile table 304 indicates which of the CAM blocks 331 are selected by the external NPU (not shown for simplicity) for the requested search operation. In addition, each of the search profiles can be used to initiate different types of search operations that require only a selected subset of the total number of available CAM blocks 331.

For example, as mentioned above, forwarding (e.g., next-hop routing) information can be stored in a first group of the CAM blocks 331, packet classification information can be stored in a second group of the CAM blocks 331, and media access control (MAC) information can be stored in a third group of the CAM blocks 331. For such embodiments, a first set of the search profiles used for forwarding look-up operations can include information that selects different numbers of the first group of CAM blocks 331, a second set of the search profiles used for classification operations can include information that selects different numbers of the second group of CAM blocks 331, and a third set of the search profiles used for MAC look-up operations can include information that selects different numbers of the third group of CAM blocks 331. As described in more detail herein, the different groups of the CAM blocks 331 can be concurrently searched.

Each pipeline 301 includes a key filter circuit 310 and a power control unit 320. The filter circuit 310 includes an input to receive the search request (SRCH_REQ), and an output to provide an extracted search key to an associated input of the corresponding power control unit 320. For some embodiments, the search request can be a packet header that includes information including a source address (SA), a destination address (DA), MAC source and destination port addresses (MAC addresses), and protocol or type of service (ToS) information. Of course, the search request can include other routing information, and for some embodiments, can also include payload data (e.g., for deep packet inspection search operations).

The filter circuit 310 also includes a control input to receive configuration data (CFG) that indicates what type of search operation (e.g., classification lookup, next hop lookup, MAC lookup) is to be performed by the corresponding pipeline 301. For some embodiments, the configuration data can be derived from the search profile (SRCH_PFL) selected from profile table 304 by the profile ID extracted from the search request by parser circuit 302. In response to CFG, the filter circuit 310 extracts or removes from the search request one or more segments to create a search key (SK) that will be used to perform a lookup operation in the corresponding pipeline 301. Thus, for the exemplary embodiment shown in FIG. 3, each filter circuit 310 is programmable to dynamically select one or more segments of the search request in response to CFG to create a search key specific to the type of search operation associated with the corresponding pipeline 301. For other embodiments, each of the filter circuits 310(1)-310(n) can have a dedicated filter function that extracts a specified set of fields from the search request to form the search key to be used in search operations within the corresponding pipelines 301(1)-301(n).

More specifically, for some embodiments, each of filter circuits 310(1)-310(n) includes a cross-bar switch and a programming circuit (not shown for simplicity), where the programming circuit can be used to program the cross-bar switch in response to CFG to filter out particular field segments of the search request and shift bit positions of the field segments to compact the filtered segments into a compacted search key. For one embodiment, filter circuits 310 can be of the type described in commonly-owned U.S. Pat. No. 6,744,652, the entirety of which is incorporated herein by reference.

Each power control unit 320 includes a data input to receive SK from the corresponding filter circuit 310, a control input to receive CFG, a first output to generate a set of block disable signals BLK_DS for input to the block selection controller 325, and a second output to forward SK to the block selection controller 325. Further, for some embodiments, each power control unit 320 is dynamically configured in response to CFG to apply a different power reduction technique for search operations performed in the corresponding pipeline 301. By selectively applying power reduction techniques specifically tailored to different types of search operations, CAM devices configured in accordance with the present embodiments can utilize variances in different types of search operations to more effectively reduce power consumption, as compared to conventional CAM devices that apply the same power reduction technique to all types of search operations. More specifically, because the power control units 320(1)-320(n) are integrated within respective search pipelines 301(1)-301(n), each of power control units 320(1)-320(n) can not only apply a different power reduction technique to its pipeline, but also can dynamically adjust the number of CAM blocks 331 that are enabled for the associated search operation by selectively overriding instructions contained in the associated search profile ID that request a predetermined number of the CAM blocks 331 for the search operation.

Although not shown in FIG. 3 for simplicity, for some embodiments, each power control unit 320 includes a function generator to generate the block disable signals (BLK_DS) provided to block selection controller 325. More specifically, the function generator within the power control unit 320 performs the same predetermined logical operation on the search key to generate the block disable signals as the function generator within the control plane 340 uses on the data entries to generate the block select signals BLK_SEL. Thus, for some embodiments, the function generator provided within each power control unit 320 is a well-known cyclic redundancy check circuit. In this manner, the contents of the search key are used by the power control unit 320 to select which CAM blocks 331 to enable for searching, thereby utilizing a dynamic key-based selective searching technique that enables only a subset of the CAM blocks 331 that were originally requested by the user (e.g., as embodied in the selected search profile) for the search operations.

The CAM block selection controller 325 includes first inputs to receive the search keys from the power control units 320(1)-320(n), second inputs to receive the block disable signals BLK_DS from the power control units 320(1)-320(n), third inputs to receive the selected search profile SRCH_PFL from the profile table 304, first outputs to provide the search keys to the memory core 330, and second outputs to provide a plurality of block enable signals (BLK_EN) to memory core 330. For some search operations (e.g., MAC lookup operations), the block selection controller 325 logically combines block selection information contained in the search profile (SRCH_PFL) provided by the profile table 304 with the block disable signals (BLK_DS) provided by the power control units 320 to generate the block enable signals (BLK_EN), which in turn selectively enable the CAM blocks 331 for the search operations. As mentioned above, the search profile selected by the search profile ID identifies a predetermined group of CAM blocks 331 to enable for the associated search operation, and the power control units 320 dynamically generate the block disable signals in response to a logical function (e.g., a hashing function) performed on the extracted search key. The block disable signals are used by the block selection controller 325 to enable a selected subset of the group of CAM blocks 331 requested by the search profile, thereby further reducing power consumption during search operations by dynamically enabling a fewer number of CAM blocks 331 than were requested by the search profile.

More specifically, for some embodiments, the BLK_DS signals generated by the power control units 320 are used to override the block enabling information contained in the search profile. For example, if the search profile identifies CAM block 331(1) to be enabled for a search operation, then block selection controller 325 asserts (e.g., to logic high) the corresponding block enable signal BLK_EN to allow CAM block 331(1) to participate in the search operation if the corresponding block disable signal BLK_DS1 is not asserted by an associated power control unit 320. Otherwise, if the corresponding block disable signal BLK_DS1 is asserted by the associated power control unit 320, then block selection controller 325 de-asserts (e.g., to logic low) the corresponding block enable signal BLK_EN1 to prevent CAM block 331(1) from participating in the search operation, thereby overriding CAM block enabling information contained in the selected search profile.

Figure 4A:
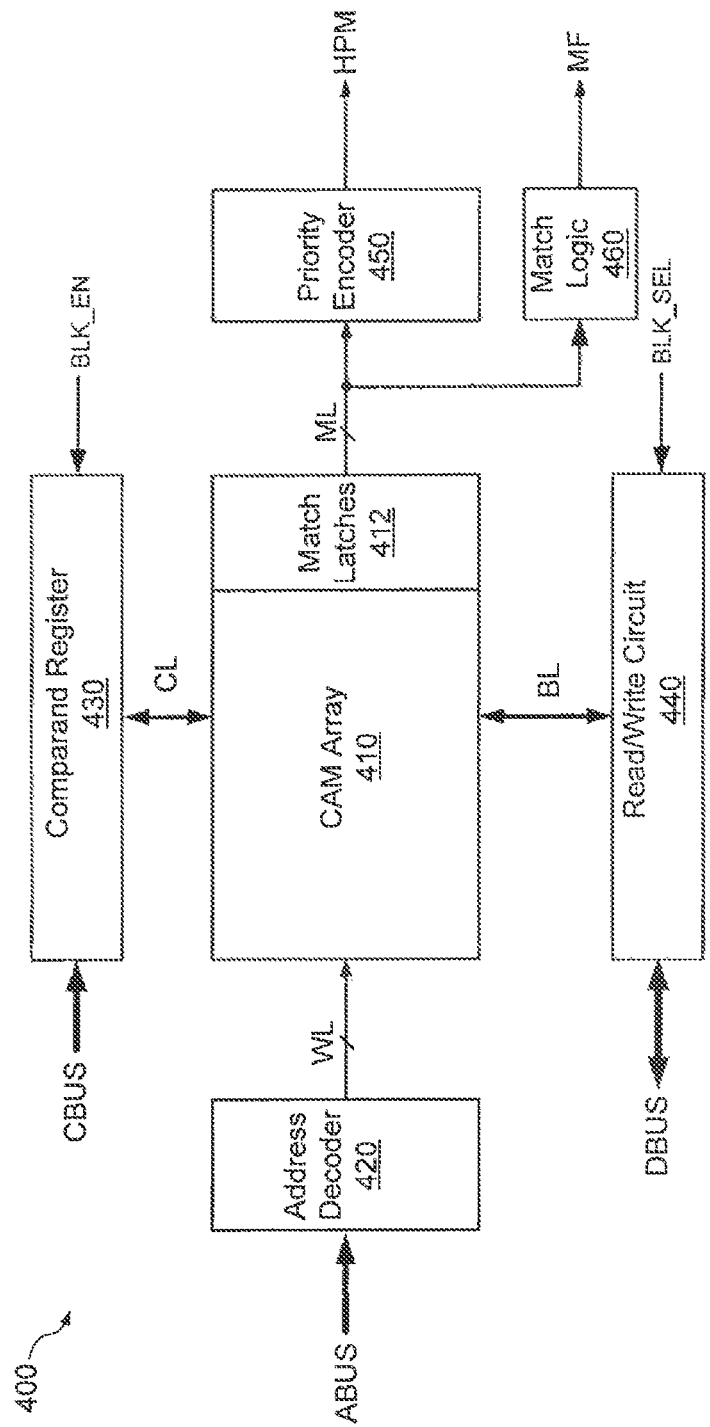
FIG. 4A is a block diagram of a CAM block that is one embodiment of the CAM blocks of FIG. 3.

FIG. 4A is a block diagram of a CAM block 400 that is one embodiment of CAM blocks 331 of FIG. 3. CAM block 400 includes a CAM array 410, an address decoder 420, a comparand register 430, a read/write circuit 440, a priority encoder circuit 450, and match logic 460. CAM array 410 includes any number of rows of CAM cells (not shown for simplicity in FIG. 4A), where each row of CAM cells can be configured to store a data word. Further, while CAM array 410 is shown in FIG. 4A as a single CAM array, it may include any number of CAM array blocks that can be independently searched.

One or more instructions and related control signals may be provided to CAM block 400 from an instruction decoder (not shown for simplicity) to control read, write, compare, and other operations for CAM block 400. Other well-known signals that can be provided to CAM block 400, such as enable signals, clock signals, and power connections, are not shown for simplicity. Further, although not shown in FIG. 4A, each row of CAM cells in CAM array 410 may have one or more validity bits to indicate whether the corresponding row (or any segment thereof) of CAM cells stores valid data.

Each row of CAM cells (not shown in FIG. 4A for simplicity) in CAM array 410 is coupled to address decoder 420 via a corresponding word line WL, and to match latches 412, to priority encoder 450, and to match logic 460 via a corresponding match line ML. For simplicity, the word lines and match lines are represented collectively in FIG. 4A. Address decoder 420 is well-known, and includes circuitry to select corresponding rows in CAM array 410 for read, write, and/or other operations in response to an address received from an address bus ABUS using the word lines WL. For other embodiments, addresses may be provided to address decoder 420 from another suitable bus and/or circuitry.

The match lines ML provide match results for compare operations between comparand data (e.g., a search key) and data stored in CAM array 410. Priority encoder 450, which is well-known, uses the match results indicated on the match lines and latched in the match latches 412 to determine the matching entry that has the highest priority number associated with it and generates the index or address of this highest priority match (HPM). In addition, priority encoder 450 may use the validity bits from CAM array 410 to generate the next free address that is available in CAM array 410 for storing new data. Although not shown in FIG. 4A, for some embodiments, priority encoder 450 may provide the next free address to the address decoder 420.

Match logic 460, which is well-known, uses the match results indicated on the match lines to generate a match flag (MF) indicative of a match condition in CAM array 410. If there is more than one matching entry in CAM array 410, match logic 460 may generate a multiple match flag to indicate a multiple match condition. In addition, match logic 460 may use the validity bits from CAM array 410 to assert a full flag when all of the rows of CAM cells in CAM array 410 are filled with valid entries.

Each column of CAM cells (not shown in FIG. 4A for simplicity) in CAM array 410 is coupled to comparand register 430 via one or more corresponding comparand lines CL, and is coupled to read/write circuit 440 via one or more corresponding bit lines BL. For simplicity, the comparand lines CL and bit lines BL are represented collectively in FIG. 4A. Comparand register 430 is well-known, and is configured to provide a search key (e.g., a comparand word) received from a comparand bus CBUS to CAM array 410 during compare operations with data stored therein. For other embodiments, the search key can be provided to CAM array 410 via another bus and/or circuit (e.g., from a corresponding pipeline 301 of FIG. 3).

Comparand register 430 also includes a control input to receive a block enable signal (BLK_EN) that can be used to selectively enable CAM array 410 for search operations. For example, assertion of BLK_EN (e.g., to logic high) can enable comparand register 430 to forward a search key to CAM array 410 for comparison with data stored therein, while de-assertion of BLK_EN (e.g., to logic low) can prevent comparand register 430 from forwarding the search key to CAM array 410, thereby preventing the search key from being compared with data stored in CAM array 410. For another embodiment, the block enable signal BLK_EN can be provided to CAM array 410 to selectively prevent the match lines ML from being pre-charged, thereby effectively preventing data stored in CAM array 410 from participating in the search operations. For yet another embodiment, the block enable signal BLK_EN can be used to gate control signals that enable search operations in CAM array 410, for example, so that de-assertion of BLK_EN prevents various clock and control signals from initiating search operation in CAM array 410. In this manner, the block enable signals generated by the CAM block selection controller 325 (e.g., in response to the search profile and the block disable signals generated by the power control units 320) can selectively enable and disable CAM blocks 400 during search operations.

Read/write circuit 440 includes well-known write drivers to write data entries received from a data bus DBUS to CAM array 410 via the bit lines BL, and includes well-known sense amplifiers to read data from CAM array 410 onto DBUS. For other embodiments, read/write circuit 440 may be coupled to a bus other than DBUS. Further, although not shown in FIG. 4A for simplicity, CAM device 400 can include a well-known global mask circuit (e.g., coupled to the comparand register 430) that can selectively mask the bits of the search key provided to the CAM array 410.

Read/write circuit 440 also includes a control input to receive block select signals (BLK_SEL) that can be used to selectively enable CAM array 410 for read and write operations. As described above with respect to FIG. 3, assertion of BLK_SEL (e.g., to logic high) can enable read/write circuit 440 to write a data entry to CAM array 410 for storage therein at a location indicated by an address provided on ABUS, while de-assertion of BLK_SEL (e.g., to logic low) can prevent read/write circuit 440 from forwarding the data entry to CAM array 410, thereby preventing the data entry from being stored in CAM array 410.

Figure 4B:
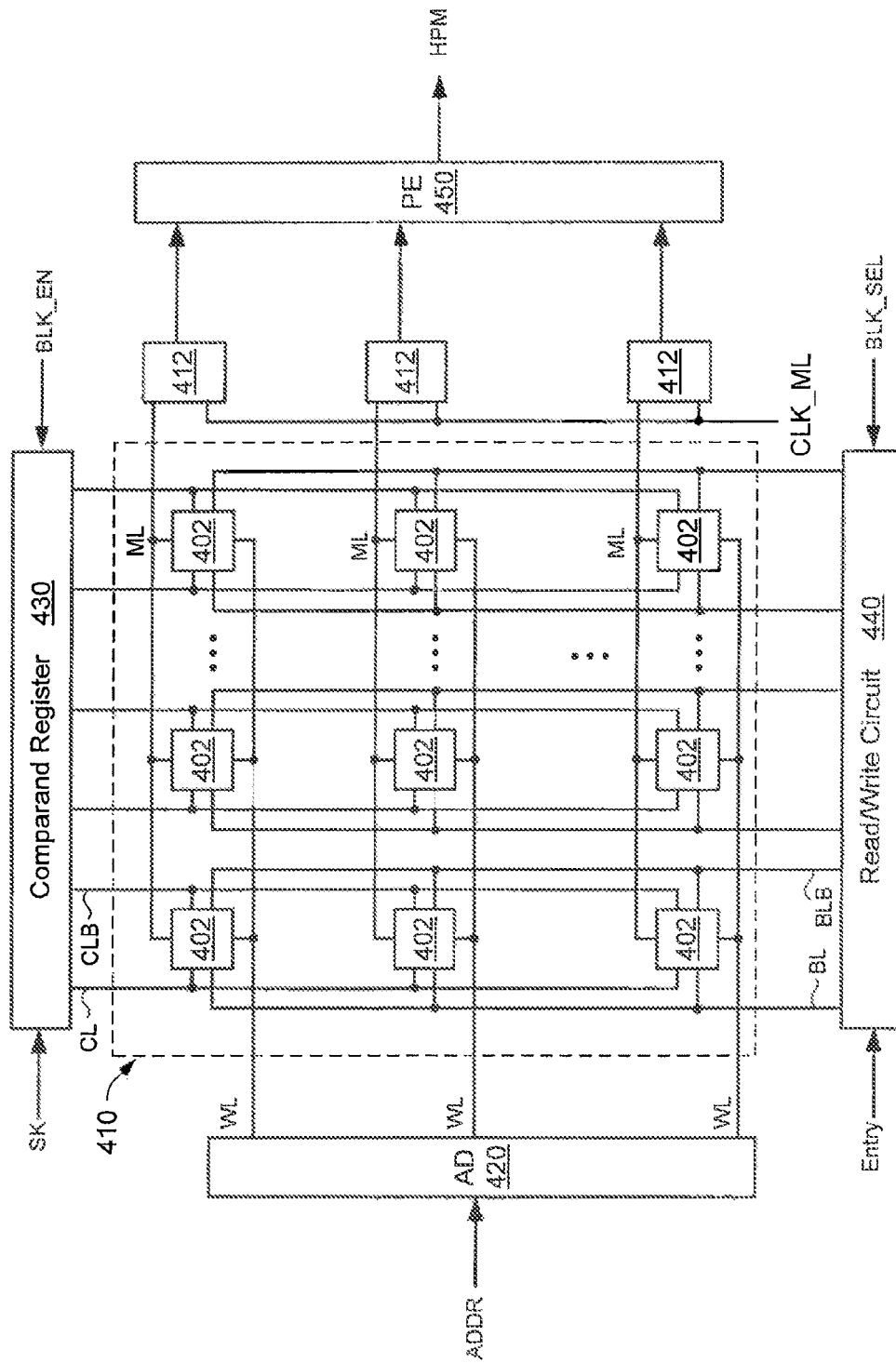
FIG. 4B is a block diagram of one embodiment of the CAM array of FIG. 4A.

FIG. 4B is a more detailed block diagram of the CAM array 410 of FIG. 4A. CAM array 410 is shown to include a plurality of CAM cells 402 organized in any number of rows and columns. The CAM cells 402 can be any suitable type of CAM cell including, for example, binary CAM cells, ternary CAM cells, and/or quaternary CAM cells. As noted above, each row of CAM array 410 may also include one or more validity bits. Each row of CAM cells 402 is coupled to a match line ML and to a word line WL. Each word line WL is driven by address decoder 420 (see also FIG. 4A) to select one or more rows of CAM cells 402 for writing or reading. Each match line ML is coupled to priority encoder 450 via a corresponding match latch 412. The match latches 412 are clocked by a match latch clock signal CLK_mL in a well-known manner. Each column of CAM cells 402 in CAM array 410 is coupled to read/write circuit 440 via a complementary bit line pair BL/BLB, and to comparand register 430 via a complementary comparand line pair CL/CLB.

During a pre-charge phase of a search operation, the match lines ML are pre-charged (e.g., to logic high), and each set of complementary comparand line pairs CL/CLB are driven to the same predetermined logic level. Then, during search operations, the comparand register 430 provides the search key (e.g., the comparand word) to the CAM cells 402 by driving each pair of complementary comparand lines CL/CLB to opposite logic states indicative of the corresponding bit of the search key. For example, to provide a logic low comparand bit (C) to a column of CAM cells, the corresponding comparand line CL is driven to a first logic state (e.g., logic low) and the corresponding complementary comparand line CLB is driven to a second logic state (e.g., logic high); conversely, to provide a logic high comparand bit C to the column of CAM cells, the corresponding comparand line CL is driven to the second logic state (e.g., logic high) and the corresponding complementary comparand line CLB is driven to the first logic state (e.g., logic low).

Then, during an evaluation phase of the search operation, if all the CAM cells 402 in a particular row match the corresponding bits of the search key, then the match line ML remains in its logic high state to indicate the match condition. Conversely, if one or more of the CAM cells 402 in the row do not match the corresponding bit of the search key, then mismatching CAM cells 402 discharge the match line ML (e.g., toward ground potential) to indicate the mismatch condition.

Figure 5:
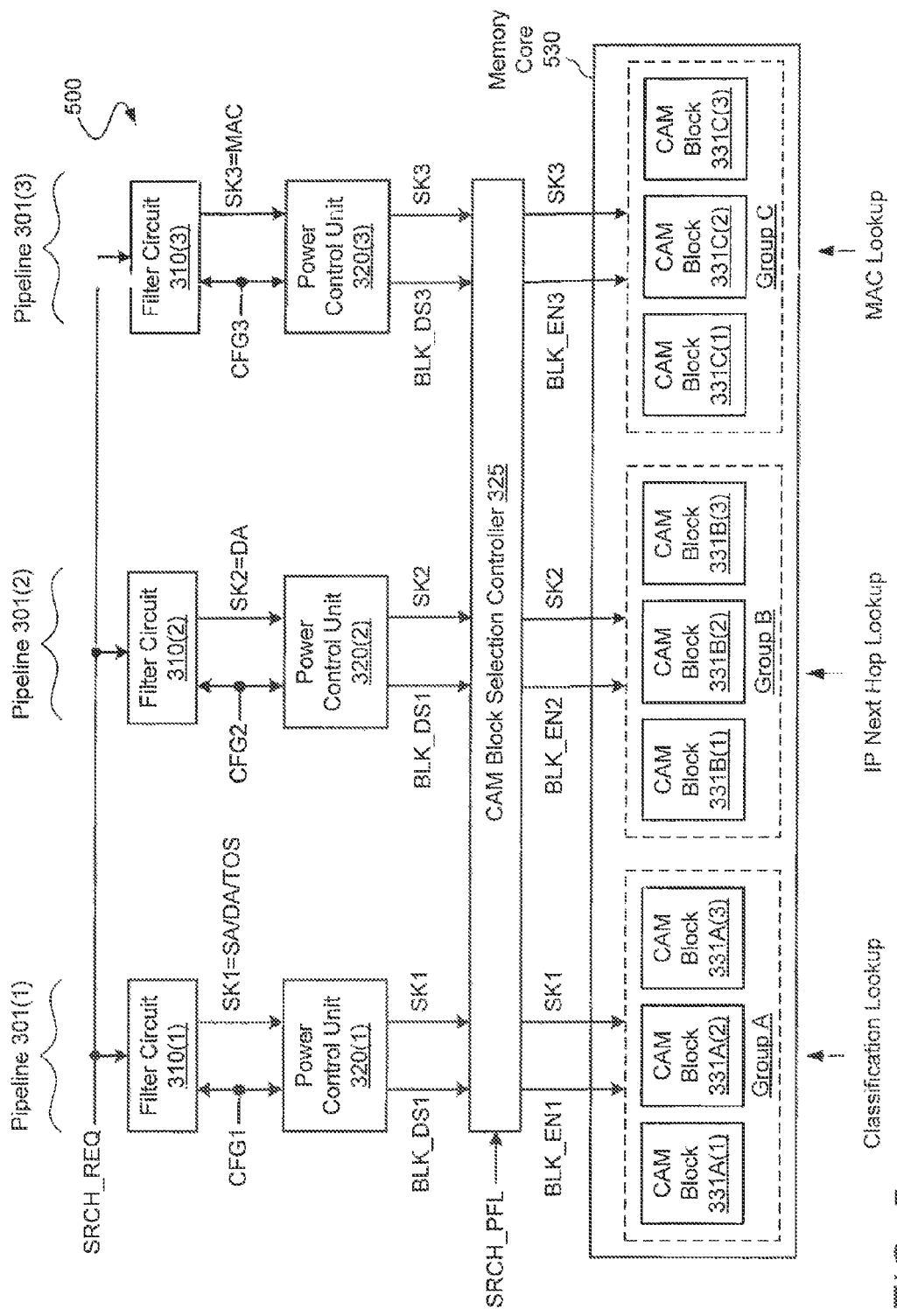
FIG. 5 is a block diagram of the multi-pipelined content search system of FIG. 4 configured to concurrently perform classification, IP next hop, and MAC lookup operations in accordance with some embodiments.

As mentioned above, CAM devices in accordance with the present embodiments can not only perform different types of search operations concurrently using different data tables stored in the device, but can also apply a different power reduction technique to each different type of search operation in a manner that takes advantage of variances between the characteristics of the different search operations. For example, FIG. 5 shows a CAM device 500 that is configured to perform concurrent search operations for classification lookups, IP next hop lookups, and MAC lookups. For example, many classification lookups compare 128-bit search keys with ACL rules stored in the CAM device, many next-hop lookup compare either 32-bit IPv4 or 128-bit IPv6 search keys with destination addresses stored in the CAM device, and many MAC lookups compare 48-bit search keys with MAC addresses stored in the CAM device. CAM device 500, which is one embodiment of CAM device 300 of FIG. 3, includes 3 pipelines 301(1)-301(3) and a memory core 530 having 3 groups of CAM blocks 331A, 331B, and 331C. Further, although each of groups A-C is shown to include 3 CAM blocks 331, for other embodiments, each group can include any number of CAM blocks. In addition, as mentioned above, each group can include any of the CAM blocks 331, regardless of their physical location within the memory core 330, and each pipeline 301 can select and access any of the CAM blocks 331 within memory core 330. Thus, each power control unit 320 can selectively disable and control the power consumption of any CAM block 331 within memory core 330.

As depicted in FIG. 5, the first pipeline 301(1) is configured by CFG1 to perform classification lookups, and is associated with a first group of CAM blocks 331A(1)-331A(3) that store rules related to one or more ACLs. In response to CFG1, filter circuit 310(1) is configured to extract the SA, DA, and TOS from the input string to create a first search key SK1 that can be used for classification lookups with data stored in the first group of CAM blocks 331A(1)-331A(3). Because packet classification lookups (also commonly known as ACL lookups) involve searching a number of rules of an ACL to determine what action is to be taken for a given packet (e.g., either permit or deny the packet), data within CFG1 can configure power control unit 320(1) to apply a suitable ACL power reduction technique when selectively enabling one or more of the first group of CAM blocks 331A.

The second pipeline 301(2) is configured by CFG2 to perform IP next hop lookups, and is associated with a second group of CAM blocks 331B(1)-331B(3) that store addresses (e.g., IPv4 and/or IPv6 addresses) related to FIB routing tables. In response to CFG2, filter circuit 310(2) is configured to extract the DA from the input string to create a second search key SK2 that can be used for IP next hop lookups with data stored in the second group of CAM blocks 331B(1)-331B(3). Because next hop lookups involve longest-prefix match (LPM) searches, data within CFG2 can configure power control unit 320(2) to apply suitable LPM power reduction techniques when selectively enabling one or more of the second group of CAM blocks 331B.

The third pipeline 301(3) is configured by CFG3 to perform MAC lookups, and is associated with a third group of CAM blocks 331C(1)-331C(3) that store MAC entries. In response to CFG3, filter circuit 310(3) is configured to extract the MAC addresses from the input string to create a third search key SK3 that can be used for MAC lookups with data stored in the third group of CAM blocks 331C(1)-331C(3). Because MAC lookups involve exact match searches, data within CFG3 can configure power control unit 320(3) to apply exact match power reduction techniques when selectively enabling one or more blocks of the third group of CAM blocks 331C. More specifically, for exemplary embodiments described herein, data within CFG3 can configure power control unit 320(3) to use the hashing function provided by its internal function generator (not shown for simplicity) to generate the block disable signals BLK_DS, which as described above can be used to override CAM block enabling information contained in the associated search profile (e.g., by disabling one or more CAM blocks 331 that were requested by the search profile for the MAC lookup operation).

Figure 6A:
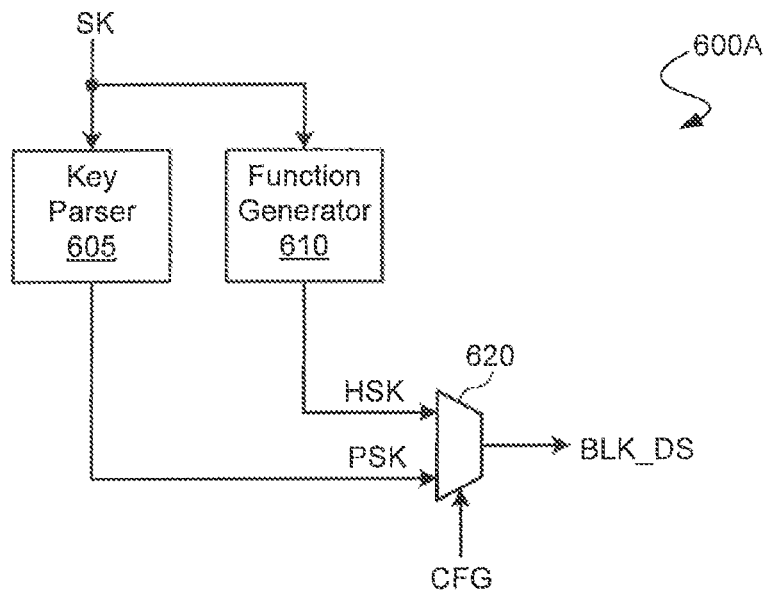
FIG. 6A is a block diagram of one embodiment of the power control unit of FIG. 3.

FIG. 6A shows a power control unit 600A that is one embodiment of power control unit 320 of FIG. 3. Power control unit 600A includes a key parser 605, a function generator 610, and a multiplexer (MUX) 620. Referring also to FIG. 3, key parser 605 has an input to receive the search key (SK) from the key filter circuit 310 in the corresponding pipeline 301, and includes an output coupled to a first input of MUX 620. In operation, key parser 605 selects a number of most-significant bits (MSBs) of the search key SK to provide as a parsed search key (PSK) to MUX 620. For some embodiments, the number of parsed search key bits can be dynamically selected by a control signal (not shown for simplicity). For other embodiments, the number of parsed search key bits is a predetermined integer. For one embodiment, the key parser 605 selects the 10 most significant bits (MSBs) of the search key to generate the parsed search key PSK.

Function generator 610 includes an input to receive SK, and includes an output coupled to a second of MUX 620. In operation, function generator 610 performs a predetermined logical operation on the search key to generate a hashed search key (HSK) that is provided to the MUX 620. According to the present embodiments, function generator 610 performs the same predetermined logical operation as the function generator provided within the control plane 340 of FIG. 3. Thus, for some embodiments, the function generator 610 is a well-known cyclic redundancy check circuit.

MUX 620 includes a control input to receive a corresponding CFG data signal, and includes an output to generate the block disable (BLK_DS) signals for the group of CAM blocks 331 associated with the corresponding pipeline. As mentioned above, the BLK_DS signals selectively disable one or more CAM blocks 331 in the pipeline's corresponding CAM block group that were requested (e.g., enabled) by the associated search profile. When CFG is in a first state, MUX 620 uses the parsed search key PSK to generate the BLK_EN signals, and when CFG is in a second state, MUX 620 uses the hashed search key HSK to generate the BLK_EN signals. Note that the CFG signal can be derived from the search request and/or the selected search profile. For other embodiments, key parser 605 and MUX 620 can be omitted such that function generator 610 generates the BLK_DS signals.

Using the hashing function to generate a hashed data entry that selects a particular CAM block 331 for storage during write operations and then using the same hashing function to generate a hashed search key that enables a subset of the CAM blocks 331 for search operations not only reduces power consumption during search operations but also ensures correct search results because any data entry that could possibly match the search key during a search operation would have been stored (e.g., by control plane 340) in CAM blocks 331 that are (1) enabled by the search profile and (2) not disabled by the block disable signal generated by power control unit 600A.

For example, consider an exemplary embodiment described above in which memory core 330 includes 8 CAM blocks 331(0)-331(7) assigned to MAC lookup operations and the function generator provided within control plane 340 (see also FIG. 3) performs a hash function on a data entry to generate a hashed data entry having an integer value between 0 and 7 (inclusive) that selects one of the CAM blocks 331 for storage. Thus, for example, if the function generator provided within control plane 340 generates a hashed data value of 2 for a particular data entry, then the particular data entry is stored in CAM block 331(2).

Thereafter, during a search operation, the received search key is hashed by function generator 610 to generate the hashed search key (HSK), which in turn enables a subset of the corresponding pipeline's associated CAM blocks 331. For example, if the hashed search key has a value of 2, which in results in the enabling of CAM block 331(2) by assertion of BLK_EN2, then all data entries that could possibly match the search key (e.g., including the particular data entry) would have been stored in CAM block 331(2) by the control plane 340. In this manner, only CAM block(s) 331 that store data entries that could match the search key are enabled for the search operation, thereby reducing power consumption by disabling other CAM blocks 331 which do not store entries that could match the search key. Conversely, if the hashed search key is of another value that does not select CAM block 331(2) to participate in the search operation, then CAM block 331(2) can be disabled because the search key could not match entries stored therein.

Figure 6B:
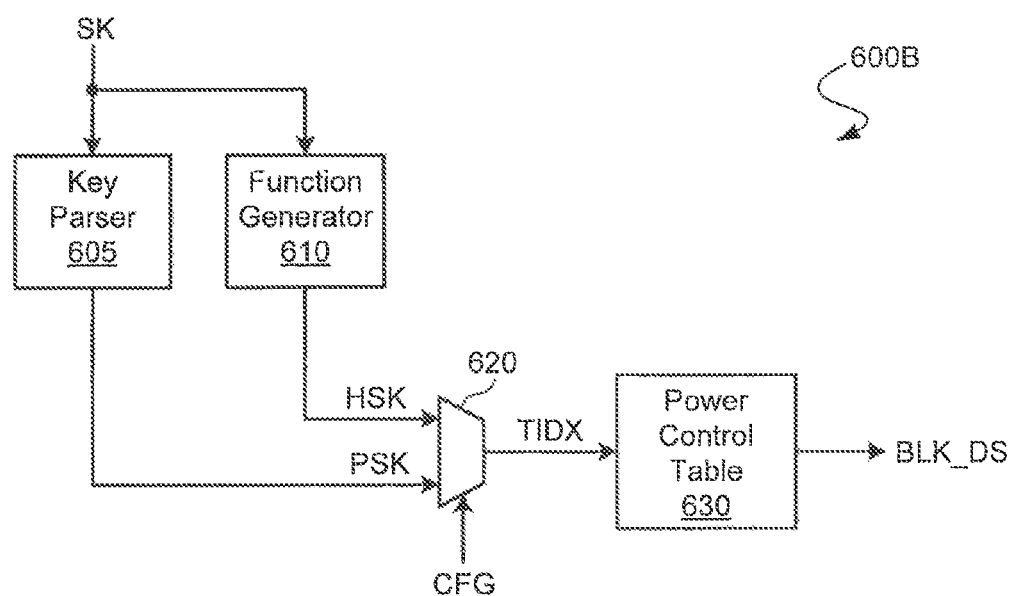
FIG. 6B is a block diagram of another embodiment of the power control unit of FIG. 3.

FIG. 6B shows a power control unit 600B that is another embodiment of power control unit 320 of FIG. 3. In addition to all of the elements of power control unit 600A of FIG. 6A, power control unit 600B includes a power control table 630 that selectively provides one of a plurality of sets of block disable signals BLK_DS in response to either the hashed search key HSK or the parsed search key PSK to the CAM block selection controller 325 of FIG. 3. More specifically, power control table 630 includes an input to receive a table index (TIDX) from the output of MUX 620, and includes a number of storage locations. Each storage location in table 630 stores a table entry that includes a plurality of block disable signals that selectively enable a corresponding subset of the CAM blocks 331 requested by the search profile for the search operation.

For example, when CFG is driven to the second state, the hashed search key HSK is used as a look-up value to select one of the table entries stored in the power control table 630, and subsequently the set of block disable signals within the selected table entry selectively override the block enable instructions associated with the search profile to enable only a subset of the CAM blocks 331 that were originally requested by the search profile for the search operation. For some embodiments, each table entry in power control table 630 includes a unique combination of asserted disable signals that overrides the search profile instructions to enable a unique subset of the CAM blocks 331 originally requested for the search operation. Further, for some embodiments, the configuration data CFG indicates how many of the CAM blocks 331 are requested for the search operation.

Figure 6C:
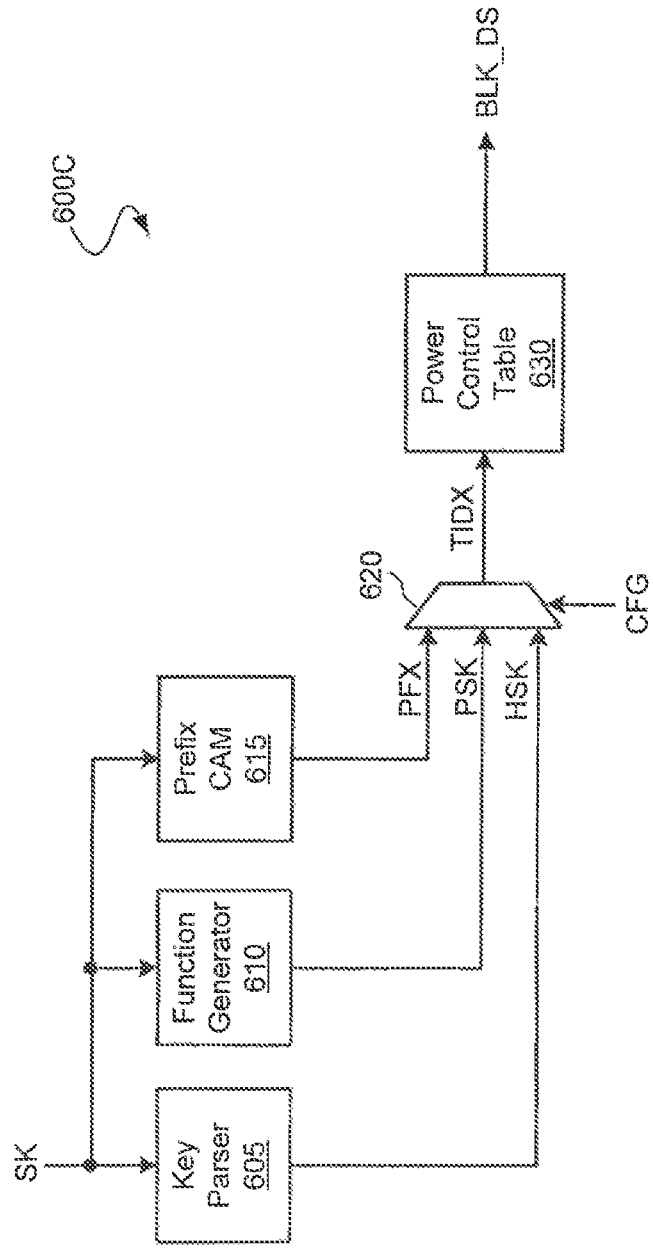
FIG. 6C is a block diagram of yet another embodiment of the power control unit of FIG. 3.

FIG. 6C shows a power control unit 600C that is another embodiment of power control unit 320 of FIG. 3. In addition to all of the elements of power control unit 600B of FIG. 6B, power control unit 600C includes a prefix CAM device 615 that stores a plurality of prefix values that can be used to reduce power consumption associated with IP next hop lookup operations and/or packet classification (e.g., ACL) lookup operations performed in selected CAM blocks 331 of memory core 330. For one example, when power control unit 600C is used for an IP next hop lookup operation, the prefix CAM 615 can store prefixes defining sub-tables within the FIB table with similar numbers of prefixes. Then, during search operations, the prefix CAM device 615 is searched for a matching prefix entry (PFX), which in turn can be used to enable one or more corresponding CAM blocks 331 of memory core 330 that correspond to the FIB sub-table. When the FIB table is updated, prefixes are written to the correct sub-table to ensure correct operation with power control. For another example, when power control unit 600C is used for a packet classification lookup operation, the prefix CAM device 615 can store covering prefix entries that indicate ACL rules having common fields (e.g., common SA and/or OA values). Then, during search operations, the prefix CAM device 615 is searched for a matching covering prefix entry (PFX), which in turn can be used to enable one or more corresponding CAM blocks 331 of memory core 330 that store rule entries that can possibly match the search key.

Figure 6D:
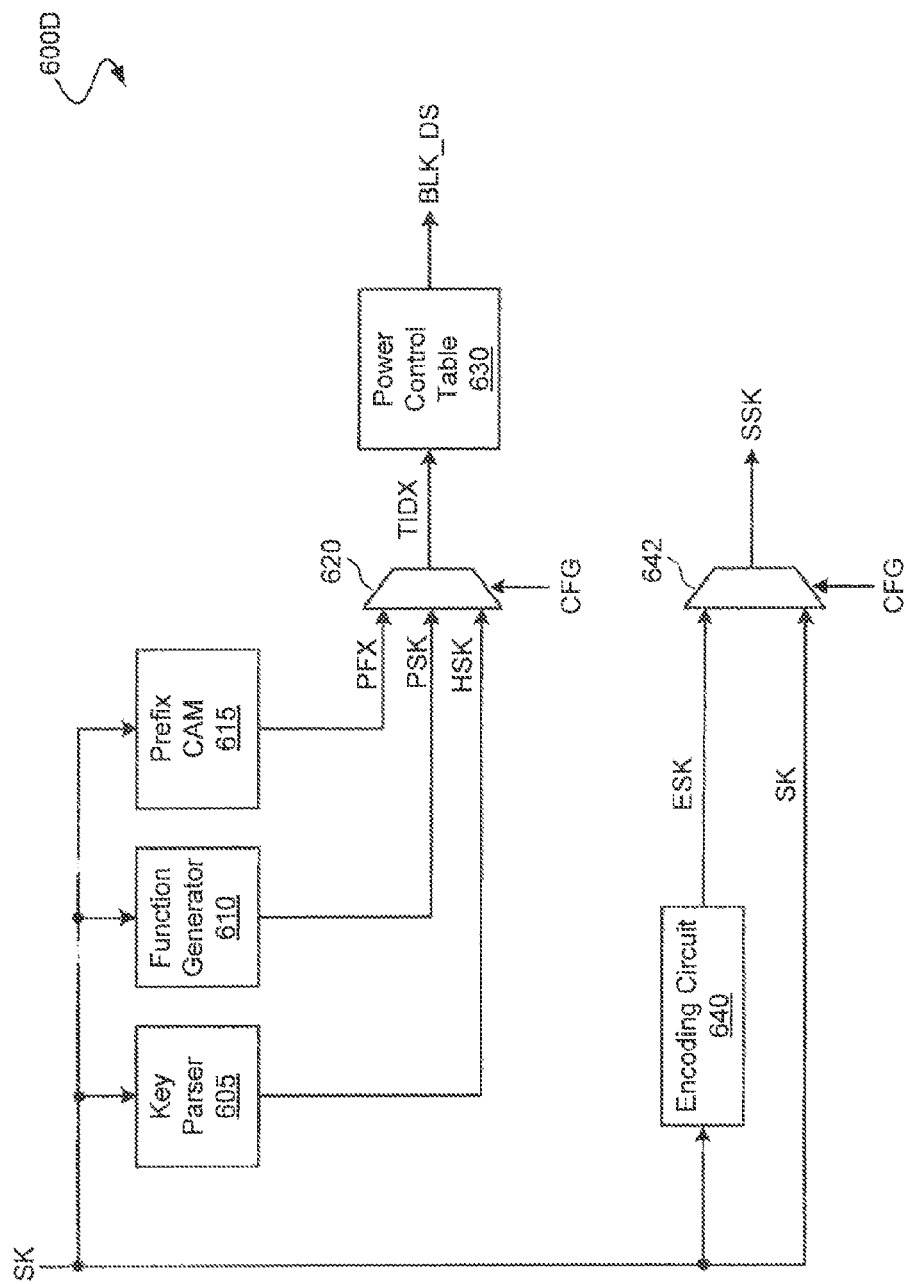
FIG. 6D is a block diagram of still another embodiment of the power control unit of FIG. 3.

FIG. 6D shows a power control unit 600D that is another embodiment of power control unit 320 of FIG. 3. In addition to all of the elements of power control unit 600C of FIG. 6C, power control unit 600D includes an encoding circuit 640 and a second MUX 642. Encoding circuit 640 includes an input to receive the search key and is configured to generate an encoded search key (ESK). For some embodiments, the ESK is a balanced encoded search key, as described in more detail below with respect to FIG. 7. MUX 642 includes a first input to receive SK, a second input to receive ESK, a control terminal to receive CFG, and an output to provide the selected search key (SSK) to the selectively enabled CAM blocks 331 for the search operation. Thus, in response to CFG, MUX 642 provides either the search key (SK) or the encoded search key (ESK) to the CAM blocks 331 for the search operation.

As mentioned above, for some embodiments, encoding circuit 640 uses an encoding scheme that represents an encoded data word as a balanced binary word. A binary word of length m may be called a balanced binary word if it contains exactly m/2 ones (logic high values) and m/2 zeros (logic low values). For example, the binary word 00001111 is balanced because it includes an equal number of logic high and logic low values. However, the binary word 00000000 is not balanced because it does not include an equal number of logic high and logic low values.

Another property of balanced binary words is that the positions of the logic high values (1s) in one balanced binary word will never be a subset of the positions of the logic high values in another balanced binary word. For example, the position of the logic high values in the binary number 00001000 is not balanced because, among other reasons, they are a subset of the position of the logic high values in 00001111. On the other hand, the binary number 101001 is not a subset of 111000, 101010, or 100101, and is therefore considered to be balanced.

FIG. 7 is a table 700 depicting storage capacities of embodiments that employ encoding schemes to generate and store balanced binary words in an array of quaternary CAM cells (also known as XY CAM cells), where T represents the number of XY CAM cells in a row of a CAM array, S represents the number of different balanced data words that can be stored in T CAM cells, and N represents the number of CAM cells needed to store an equivalent amount of un-encoded data. For some embodiments, the number of different balanced words possible given a number T of XY CAM cells may be expressed as $S=(2T)!/(T!)^2$, and the equivalent binary word data width may be expressed as $N=\text{Trunc}(\log_2 S)$.

For example, a CAM row including 80 CAM cells may store a 160-bit balanced data word that is capable of representing $9.2 \times 10^{46}$ distinct values. To store the equivalent amount of data without balanced encoding, the size of the CAM row would need to be increased from 80 cells to 156 cells. As another example, as shown by FIG. 7, a CAM row including 3 CAM cells may store a 6-bit balanced data word that is capable of identifying 20 distinct values. To store the equivalent amount of data using prior approaches, the size of the CAM row would need to be increased from 3 cells to 4 cells. Thus, using balanced encoding can significantly increase the density of stored data. In addition, by increasing the density of stored data, the number of comparisons that need to be performed is reduced, thereby also reducing the amount of power consumed by match lines and data lines of the CAM array. A more detailed description of techniques for creating, storing, and searching CAM arrays using balanced encoding can be found in commonly-owned U.S. Pat. No. 8,023,298, the entirety of which is incorporated by reference herein.

While particular embodiments have been shown and described, it will be obvious to those skilled in the art that changes and modifications may be made without departing from this disclosure in its broader aspects and, therefore, the appended claims are to encompass within their scope all such changes and modifications as fall within the true spirit and scope of this disclosure.

Further, it should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media).

What is claimed is:

1. A content search system including a plurality of search pipelines, each of the plurality of search pipelines configured to perform any one of a plurality of different types of search operations for a received data packet, the content search system comprising:
   a parser circuit;
   a profile table coupled to the parser circuit and configured to receive input from the parser circuit;
   a plurality of content addressable memory (CAM) blocks for storing data associated with any of the different types of search operations;
   a CAM block selection controller coupled to the profile table, coupled to the plurality of CAM blocks, and configured to receive input from the profile table;
   a control plane coupled to the plurality of CAM blocks; and
   wherein each of the plurality of search pipelines comprises:
   a key filter circuit, having an input to receive header information from the received data packet, configured to generate a corresponding search key specific to the type of search operation assigned to the pipeline;
   a power control unit having a first input to receive the search key, having a second input to receive configuration data indicative of the type of search operation assigned to the pipeline, and having outputs coupled to the CAM block selection controller;
   wherein the power control unit is configured to selectively apply one of a plurality of different power control techniques to the search pipeline in response to the configuration data.

2. The system of claim 1, wherein the power control unit further comprises a function generator configured to generate a block disable signal.

3. The system of claim 2, wherein the function generator comprises a cyclic redundancy check circuit.

4. The system of claim 2, wherein the function generator is further configured to perform a hash function.

5. The system of claim 1, wherein a first CAM block of the plurality of CAM blocks has a first size, a second CAM block of the plurality of CAM blocks has a second size, and the first size and the second size are different.

6. The system of claim 1, wherein a first portion of the plurality of CAM blocks are configured to be organized into a first group of CAM blocks, and a second portion of the plurality of CAM blocks are configured to be organized into a second group of CAM blocks.

7. The system of claim 6, wherein the first group of CAM blocks and the second group of CAM blocks are each configured to store a different table.

8. The system of claim 7, wherein the first group of CAM blocks is configured to store an access control list.

9. The system of claim 7, wherein the first group of CAM blocks is configured to store a forwarding information base.

10. The system of claim 7, wherein the first group of CAM blocks is configured to store a plurality of media access control addresses.

11. The system of claim 7, wherein the first group of CAM blocks and the second group of CAM blocks are configured to have addresses that are discontiguous from each other.

12. The system of claim 1, wherein the parser circuit is configured to receive a search request from an external source.

13. The system of claim 1, wherein the parser circuit is configured to receive a packet header and a search profile identifier.

14. The system of claim 13, wherein the packet header is configured such that a search key can be derived therefrom.

15. The system of claim 1, wherein the control plane is configured to control write operations to a memory core.

16. A content search system including a plurality of search pipelines, each of the plurality of search pipelines configured to perform any one of a plurality of different types of search operations for a received data packet, the content search system comprising:

a parser circuit;
a profile table coupled to the parser circuit and configured to receive input from the parser circuit;
a memory core including a plurality of content addressable memory (CAM) blocks for storing data associated with any of the different types of search operations;
a CAM block selection controller coupled to the profile table, and coupled to the memory core, and configured to receive input from the profile table;
a control plane coupled to the memory core; and
wherein each of the plurality of search pipelines comprises:
a filter circuit, having an input to receive header information from the received data packet, configured to generate a corresponding search key specific to the type of search operation assigned to the pipeline; and
a power control unit having a first input to receive the search key, having a second input to receive configuration data indicative of the type of search operation assigned to the pipeline, and having outputs coupled to the CAM block selection controller;
wherein the power control unit is configured to selectively apply one of a plurality of different power control techniques to the search pipeline in response to the configuration data; and
wherein the power control unit is configured to dynamically adjust the number of CAM blocks that are enabled for the search operation.

17. The system of claim 16, further comprising a function generator configured to generate a block disable signal, and to perform a hash function.

18. The system of claim 16, wherein a first portion of the plurality of CAM blocks are configured to be organized into a first group of CAM blocks, and a second portion of the plurality of CAM blocks are configured to be organized into a second group of CAM blocks.

19. The system of claim 16, wherein a first CAM block of the plurality of CAM blocks has a first size, a second CAM block of the plurality of CAM blocks has a second size, and the first size and the second size are different.

20. The system of claim 18, wherein the first group of CAM blocks and the second group of CAM blocks are configured to have addresses that are discontiguous from each other.

* * * * *